(12) United States Patent
Kunugimoto et al.

(10) Patent No.: US 9,766,543 B2
(45) Date of Patent: Sep. 19, 2017

(54) LIQUID TREATMENT METHOD, SUBSTRATE PROCESSING APPARATUS AND NON-TRANSITORY STORAGE MEDIUM

(71) Applicant: TOKYO ELECTRON LIMITED, Tokyo (JP)

(72) Inventors: Yuichiro Kunugimoto, Koshi (JP); Izumi Hasegawa, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 320 days.

(21) Appl. No.: 14/621,522

(22) Filed: Feb. 13, 2015

(65) Prior Publication Data

US 2015/0234277 A1 Aug. 20, 2015

(30) Foreign Application Priority Data

Feb. 14, 2014 (JP) .................................. 2014-026407

(51) Int. Cl.
| | | |
|---|---|---|
| *B05C 11/00* | (2006.01) | |
| *B05C 11/02* | (2006.01) | |
| *G03B 27/32* | (2006.01) | |
| *G03B 27/52* | (2006.01) | |
| *G03F 7/16* | (2006.01) | |
| *H01L 21/67* | (2006.01) | |
| *G03F 7/30* | (2006.01) | |
| *H01L 21/66* | (2006.01) | |

(52) U.S. Cl.
CPC ................ *G03F 7/16* (2013.01); *G03F 7/162* (2013.01); *G03F 7/30* (2013.01); *G03F 7/3021* (2013.01); *H01L 21/6715* (2013.01); *H01L 21/67023* (2013.01); *H01L 21/67051* (2013.01); *H01L 21/67253* (2013.01); *H01L 21/67288* (2013.01); *H01L 22/20* (2013.01); *H01L 22/12* (2013.01)

(58) Field of Classification Search
CPC ... G03F 7/16; G03F 7/162; G03F 7/30; G03F 7/3021; H01L 21/67023; H01L 21/67051; H01L 21/6715; H01L 21/67253; H01L 21/67288
USPC .............. 118/52, 302, 665, 712; 156/345.15; 355/27, 30, 77
See application file for complete search history.

(56) References Cited

U.S. PATENT DOCUMENTS

2008/0100809 A1    5/2008 Nakashima et al.

FOREIGN PATENT DOCUMENTS

JP    5045218 B2    10/2012

*Primary Examiner* — Colin Kreutzer
(74) *Attorney, Agent, or Firm* — Burr & Brown, PLLC

(57) ABSTRACT

In one embodiment, a liquid treatment method includes (A) imaging a discharging port part of the liquid nozzle each time the discharging process is performed to one substrate, and acquiring, from images thus obtained, size data on foreign matter possibly present at the discharging port part; and (B) based on a history of the size data arranged in chronological order, judging whether an abnormality in substrate-processing has occurred. In the item (B), if the number of continuous acquisition, indicating how many times the size data not smaller than a first threshold value has been acquired continuously, exceeds a predetermined value, then judging that an abnormality in substrate-processing has occurred.

14 Claims, 11 Drawing Sheets

LIQUID TREATMENT METHOD, SUBSTRATE PROCESSING APPARATUS AND NON-TRANSITORY STORAGE MEDIUM

CROSS REFERENCE TO RELATED APPLICATION

This application is based upon and claims the benefit of priority from Japanese patent application No. 2014-026407 filed on Feb. 14, 2014, the entire contents of which are incorporated herein by reference.

BACKGROUND OF THE INVENTION

Field of the Invention

The present invention relates to a liquid treatment method, a substrate processing apparatus, and a non-transitory storage medium.

Description of Related Art

For fine processing of substrates, photolithography is now commonly used to form uneven patterns (e.g., resist patterns) on each substrate such as a semiconductor wafer. Various processing liquids are discharged through a discharging port of a liquid nozzle, toward the surface of the substrate, to conduct the fine processing of the substrate.

In a case where a processing liquid is discharged through the discharging port of the liquid nozzle, if liquid is suspended from the end discharging port or if liquid droplets adhere to the surfaces around the discharging port, such liquid may fall onto the surface of the substrate during the discharge of the processing liquid and is thus likely to cause defects. In order to address such problem, the substrate processing apparatus described in Japanese Patent No. JP5045218B2 (corresponding to JP2008-135679A) includes means for imaging a discharging port of a liquid nozzle, means for judging based on the imaging result by the imaging means whether suspending or falling of the processing liquid from the discharging port, and means for controlling a liquid nozzle transport mechanism to perform a predetermined operation for coping with the suspending or falling of the processing liquid. The substrate processing apparatus of JP5045218B2 thus can prevent occurrence of an abnormality of processed substrate.

The substrate processing apparatus described in JP5045218B2 judges the occurrence of the suspending of the processing liquid upon comparison of a suspending degree indicator value with a predetermined threshold. If the threshold is not set appropriately, even if a small amount of liquid suspending occurs, the judging means may judge that unallowable liquid suspending or liquid falling occurs, resulting in unnecessary execution of the predetermined operation for coping with the abnormality; or even if a large amount of liquid suspending occurs, the judging means may judge that unallowable liquid suspending or liquid falling does not occur, resulting in failure of execution of the predetermined operation.

SUMMARY OF THE INVENTION

The present invention provides a technique that can highly accurately determine a probability of occurrence of an abnormality in processing of a substrate.

In one embodiment of the present invention, there is provided a liquid treatment method, employing a substrate processing apparatus that sequentially perform, to a plurality of substrates one by one, a discharging process of discharging a processing liquid through a discharging port of a liquid nozzle toward a surface of the substrate positioned below the liquid nozzle. The liquid treatment method includes: (A) imaging a discharging port part of the liquid nozzle each time the discharging process is performed to one substrate, and acquiring, from images thus obtained, size data on foreign matter possibly present at the discharging port part; and (B) based on a history of the size data arranged in chronological order, judging whether an abnormality in substrate-processing has occurred. In the item (B), if the number of continuous acquisition, indicating how many times the size data not smaller than a first threshold value has been acquired continuously, exceeds a predetermined value, then judging that an abnormality in substrate-processing has occurred.

In the foregoing embodiment, if the number of continuous acquisition, indicating how many times the size data not smaller than a first threshold value has been acquired continuously, exceeds a predetermined value, then it is judged that an abnormality in substrate-processing has occurred. Thus, acquiring of size data not smaller than the first threshold value will not immediately result in a judgment that an abnormality has occurred. In other words, two criteria need to be met in order to judge that an abnormality in substrate-processing has occurred. One is that the size data has become not smaller than the first threshold value, and the other is that the number of continuous acquisition of such size data has exceeded the predetermined value. If those two criteria are met, it is supposed that the foreign matter having a relatively-large size has continued to exist at the discharging port part of the liquid nozzle. It can be thus judged to be highly probable that the foreign matter existing at the discharging port part of the liquid nozzle would fall onto the surface of the substrate. The fact that an abnormality in substrate-processing has occurred, therefore, can also be judged accurately.

In above item (B), once the number of continuous acquisition has reached the predetermined value, the count of the number of continuous acquisition may be reset, in which case the number of continuous acquisition of the size data not smaller than the first threshold value will be newly counted from zero (0) in the processing of the following substrates. For this reason, for example after the discharging port part of the liquid nozzle has been cleaned in response to the judgment that an abnormality has occurred, the judgment whether an abnormality in substrate-processing has occurred can be performed.

In above item (B), the number of continuous acquisition may be reset if the size data becomes smaller than the first threshold value before the number of continuous acquisition reaches the predetermined value. In such a case, the probability of existence of a defect at the discharging port part of the liquid nozzle is low. It may be regarded that a defect is absent at the discharging port part of the liquid nozzle, and thus the judgment of whether an abnormality in substrate-processing has occurred can be newly executed in the liquid treatment of the following substrates.

The liquid treatment method in the foregoing embodiment may further includes (C) if the size data is not smaller than a second threshold value which is larger than the first threshold value, judging that an abnormality in substrate-processing has occurred. The second threshold value is greater than the first threshold value indicating it is highly probable that foreign matter would exist at the discharging port part of the liquid nozzle. Accordingly, when the size data is not smaller than the second threshold value, it can be determined that the large foreign matter most likely to fall onto the surface of the substrate is present at the discharging port part of the liquid nozzle.

In above item (B), if a first size data acquired at a first acquisition timing is smaller than a second size data acquired at a second acquisition timing immediately before the first acquisition timing and if an reduction amount or an reduction rate of the first size data with respect to the second size data is not smaller than a predetermined value, it may be judged that an abnormality in substrate-processing has occurred. In this case, it may be estimated that, as compared with the size of the foreign matter which has existed at the discharging port part of the liquid nozzle during the processing of the substrate immediately preceding in terms of time, the size of the foreign matter which has existed at the discharging port part of the liquid nozzle during the processing of the following substrate becomes small abruptly. It can therefore be judged that it is highly probable that the foreign matter which has existed at the discharging port part of the liquid nozzle would have later fallen onto the surface of the substrate.

The liquid treatment method in the foregoing embodiment may further include: (D) storing the images obtained upon execution of item (A) with the size data acquired from those images being associated with those images; (E) displaying on a display section the history of the size data arranged in chronological order; and (F) upon receipt of a signal for selecting any one of the size data displayed on the display section, displaying one of the acquired images corresponding to the selected size data. In this case, the history of the size data arranged in chronological order can be presented to, for example, an operator of a substrate processing apparatus, and the image corresponding to desired size data can also be presented. This facilitates identification of probable causes of a defect on the substrate.

In another embodiment, there is provided a liquid treatment method, employing a substrate processing apparatus that sequentially perform, to a plurality of substrates one by one, a discharging process of discharging a processing liquid through a discharging port of a liquid nozzle toward a surface of the substrate positioned below the liquid nozzle. The liquid treatment method includes: (A) imaging a discharging port part of the liquid nozzle each time the discharging process is performed to one substrate, and acquiring, from images thus obtained, position data indicating a height position of foreign matter possibly present at the discharging port part; and (B) based on a history of the position data arranged in chronological order, judging whether an abnormality in substrate-processing has occurred. In the item (B), if the number of continuous acquisition, indicating how many times the position data not larger than a first threshold value has been acquired continuously, exceeds a predetermined value, then judging that an abnormality in substrate-processing has occurred.

In the foregoing embodiment, if the number of continuous acquisition, indicating how many times the position data not larger than a first threshold value has been acquired continuously, exceeds a predetermined value, then it is judged that an abnormality in substrate-processing has occurred. Thus, acquiring of position data not larger than the first threshold value will not immediately result in a judgment that an abnormality has occurred. In other words, two criteria need to be met in order to judge that an abnormality in substrate-processing has occurred. One is that the position data has become not larger than the first threshold value, and the other is that the number of continuous acquisition of such position data has exceeded the predetermined value. If those two criteria are met, it is supposed that the foreign matter has continued to exist at the discharging port part of the liquid nozzle. It can be thus judged to be highly probable that the foreign matter existing at the discharging port part of the liquid nozzle would fall onto the surface of the substrate. The fact that an abnormality in substrate-processing has occurred, therefore, can also be judged accurately.

In above item (B), once the number of continuous acquisition has reached the predetermined value, the count of the number of continuous acquisition may be reset, in which case the number of continuous acquisition of the position data not larger than the first threshold value will be newly counted from zero (0) in the processing of the subsequent substrate. For this reason, for example after the discharging port part of the liquid nozzle has been cleaned in response to the judgment that an abnormality has occurred, the judgment whether an abnormality in substrate-processing has occurred can be executed again.

The liquid treatment method in the foregoing embodiment may further include: (C) when the position data not larger than a second threshold value which is smaller than the first threshold value, judging that an abnormality in substrate-processing has occurred. The second threshold value is smaller than the first threshold value indicating that it is highly probable that a defect would exist at the discharging port part of the liquid nozzle. Accordingly, when the size data is not larger than the second threshold value, it can be judged that there is an extremely high probability of foreign matter being present in an immediate vicinity of the discharging port of the liquid nozzle and falling onto the surface of the substrate.

The liquid treatment method in the foregoing embodiment may further include: (D) storing the images obtained upon execution of item (A) with the position data acquired from those images being associated with those images; (E) displaying on a display section the history of the position data arranged in chronological order; and (F) upon receipt of a signal for selecting any one of the position data displayed on the display section, displaying one of the acquired images corresponding to the selected position data. In this case, the history of the position data arranged in chronological order can be presented to, for example, an operator of the substrate processing apparatus, and the image corresponding to desired position data can also be presented. This facilitates identification of probable causes of any defects detected on the substrate.

In yet another embodiment, there is provided a substrate processing apparatus including: a liquid nozzle that discharges a processing liquid through a discharging port thereof toward a surface of a substrate positioned below; an imaging unit that images a discharging port part of the liquid nozzle; and a control section. The control section performs a control procedure when substrate processing apparatus sequentially perform, to a plurality of substrates one by one, a discharging process of discharging the processing liquid through the discharging port of the liquid nozzle. The control procedure includes: (A) causing the imaging unit to image the discharging port part of the liquid nozzle each time the discharging process is performed to one substrate, and acquiring, from images thus obtained, size data on foreign matter possibly present at the discharging port part; and (B) based on a history of the size data obtained in item (A) and arranged in chronological order, judging whether an abnormality in substrate-processing has occurred.

In the substrate processing apparatus in the foregoing embodiment, based on the history of the size data arranged in chronological order, if the number of continuous acquisition, indicating how many times the size data not smaller than a first threshold value has been acquired continuously, exceeds a predetermined value, then the control section judges that an abnormality in substrate-processing has occurred. Thus, acquiring of size data not smaller than the first threshold value will not immediately result in a judgment that an abnormality has occurred. In other words, two criteria need to be met in order to judge that an abnormality in substrate-processing has occurred. One is that the size data has become not smaller than the first threshold value, and the other is that the number of continuous acquisition of such size data has exceeded the predetermined value. If those two criteria are met, it is supposed that the foreign matter having a relatively-large size has continued to exist at the discharging port part of the liquid nozzle. It can be thus judged to be highly probable that the foreign matter existing at the discharging port part of the liquid nozzle would fall onto the surface of the substrate. The fact that an abnormality in substrate-processing has occurred, therefore, can also be judged accurately.

In still yet another embodiment, there is provided a substrate processing apparatus comprising: a liquid nozzle that discharges a processing liquid through a discharging port thereof toward a surface of a substrate positioned below; an imaging unit that images a discharging port part of the liquid nozzle; and a control section. The control section performs a control procedure when substrate processing apparatus sequentially perform, to a plurality of substrates one by one, a discharging process of discharging the processing liquid through the discharging port of the liquid nozzle. The control procedure includes: (A) causing the imaging unit to image the discharging port part of the liquid nozzle each time the discharging process is performed to one substrate, and acquiring, from images thus obtained, size data on foreign matter possibly present at the discharging port part; and (B) based on a history of the size data obtained in item (A) and arranged in chronological order, judging whether an abnormality in substrate-processing has occurred.

In the substrate processing apparatus in the foregoing embodiment, if the number of continuous acquisition, indicating how many times the position data not larger than a first threshold value has been acquired continuously, exceeds a predetermined value, then the control section judges that an abnormality in substrate-processing has occurred. Thus, acquiring of position data not larger than the first threshold value will not immediately result in a judgment that an abnormality has occurred. In other words, two criteria need to be met in order to judge that an abnormality in substrate-processing has occurred. One is that the position data has become not larger than the first threshold value, and the other is that the number of continuous acquisition of such position data has exceeded the predetermined value. If those two criteria are met, it is supposed that the foreign matter has continued to exist at the discharging port part of the liquid nozzle. It can be thus judged to be highly probable that the foreign matter existing at the discharging port part of the liquid nozzle would fall onto the surface of the substrate. The fact that an abnormality in substrate-processing has occurred, therefore, can also be judged accurately.

In a further embodiment, there is provided a computer-readable, non-transitory storage medium storing programs to cause a substrate processing apparatus to perform the method. The non-transitory storage medium may be any type, and may be a semiconductor memory, an optical recording disc, magnetic recording disk, or a magneto-optic recording disk, for example. Note that the programs can be transmitted by propagation signals (e.g., a data signal that can be supplied via a network).

DETAILED DESCRIPTION OF THE INVENTION

Embodiments of the present invention will be described referring to the accompanying drawings.

It should be noted that the embodiments disclosed herein are exemplary ones, and are not intended to limit the scope of the invention. In the description, the same elements or elements having the same function will each be assigned the same reference number, and overlapped description will be omitted.

Figure 1:
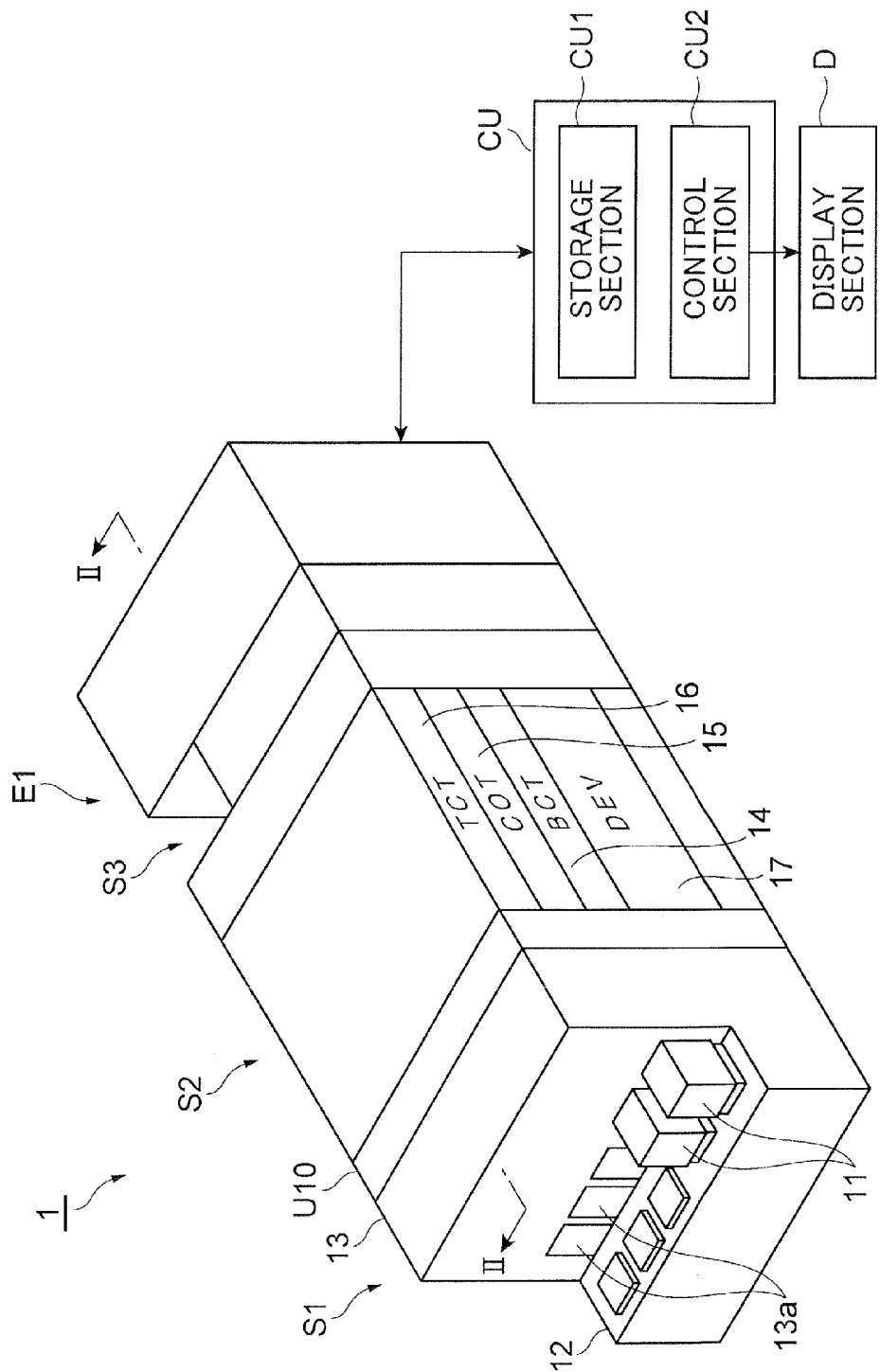
FIG. 1 is a perspective view showing a coating and developing system.
Figure 2:
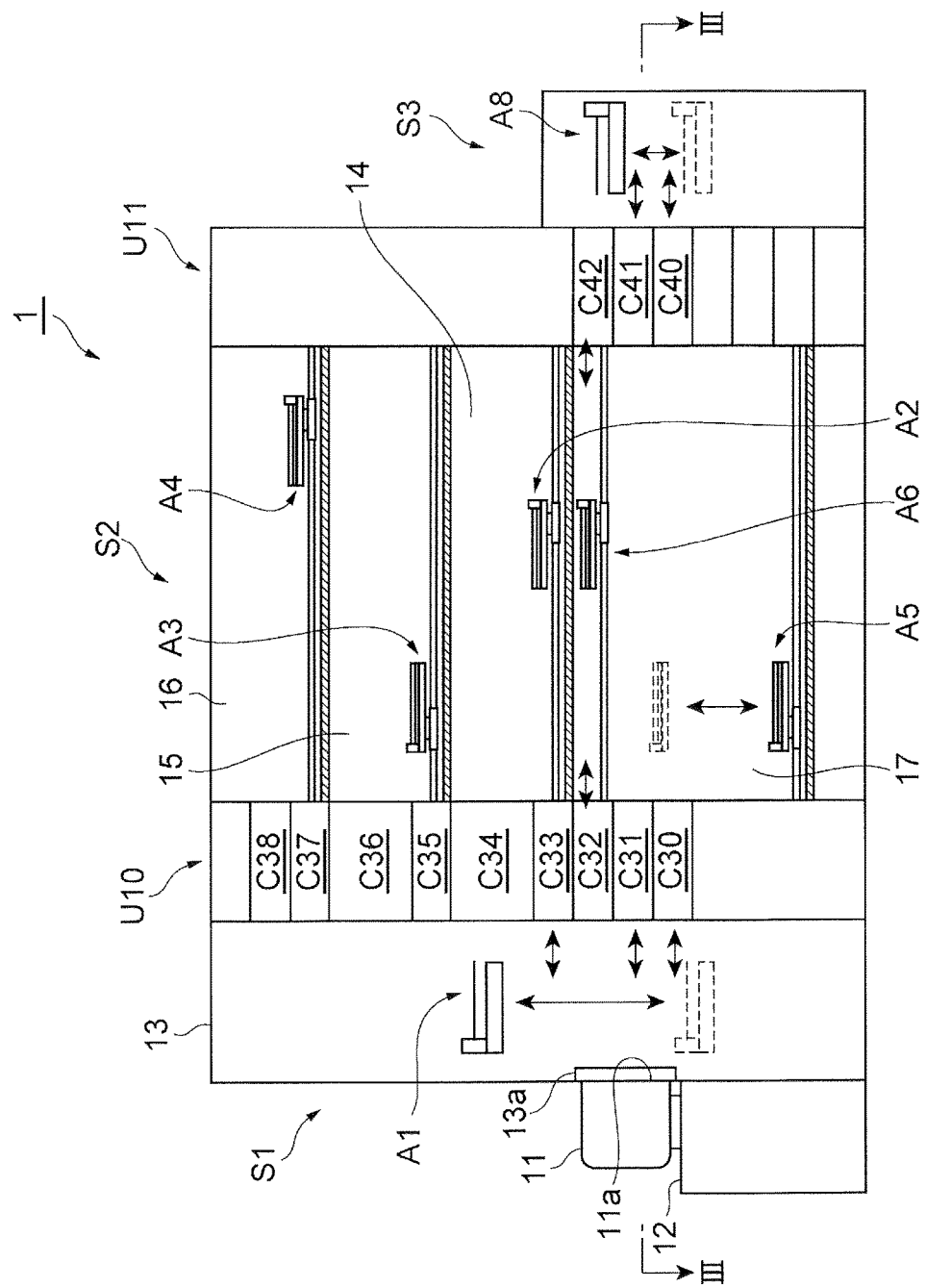
FIG. 2 is a cross-sectional view of a section indicated by line II-II in FIG. 1.
Figure 3:
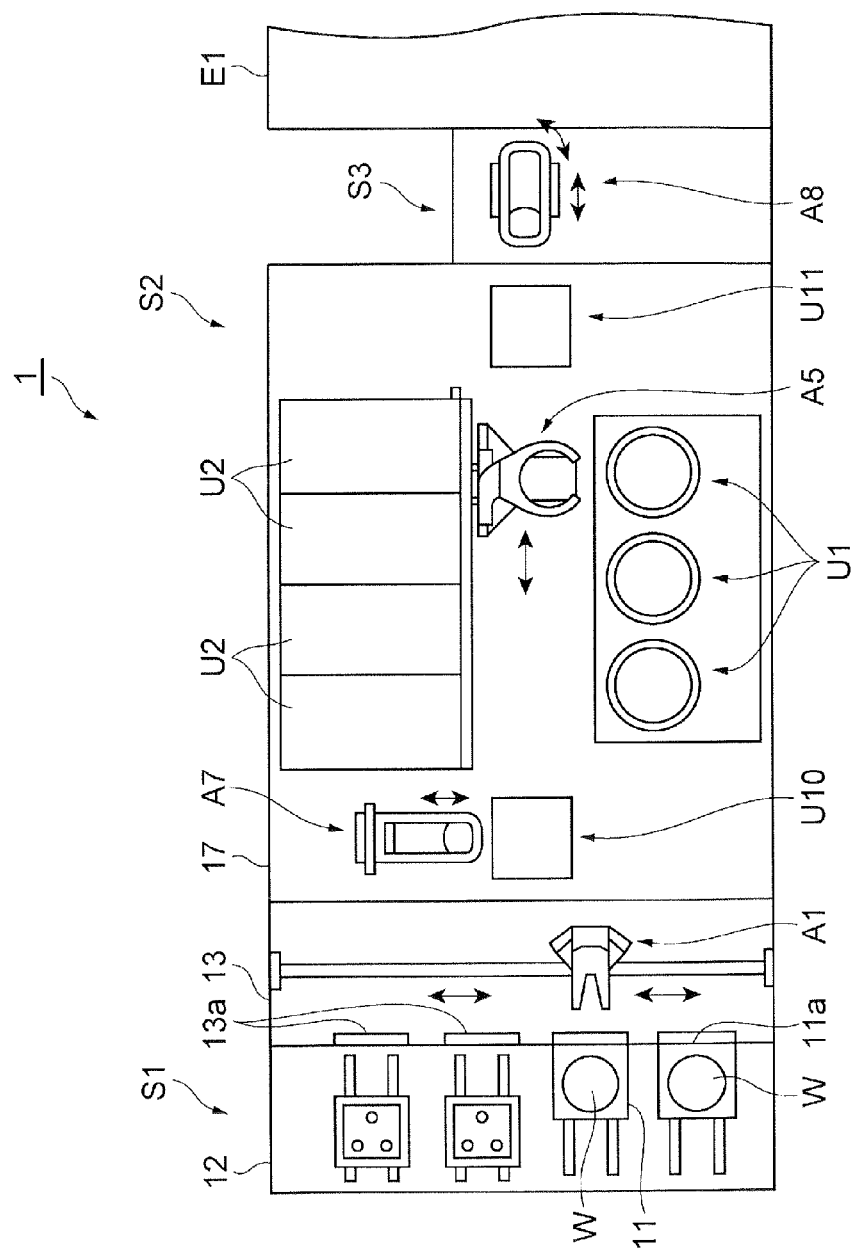
FIG. 3 is a cross-sectional view of a section indicated by line III-III in FIG. 2.

First, a configuration of a coating and developing apparatus 1 shown in FIGS. 1 to 3 is outlined below. Before a surface Wa of a wafer (substrate) W is exposed to light by an exposure apparatus E1, the coating and developing apparatus 1 conducts a process for coating the surface Wa with a resist material to form a resist film thereupon. After the exposure by the exposure apparatus E1, the coating and developing apparatus 1 conducts a developing process of the resist film formed on the surface Wa of the wafer W. While the wafer W in the present embodiment has a disc shape, the wafer may have a shape in which a portion of a circle is cut off, a polygonal shape, or any other non-circular shape.

As shown in FIGS. 1 and 2, the coating and developing apparatus 1 includes a carrier block S1, a process block S2, an interface block S3, a control unit CU that controls the operation of the coating and developing apparatus 1, and a display section D that can display the processing results of the control unit CU. In the present embodiment, the carrier block S1, the process block S2, the interface block S3, and the exposure apparatus E1 are arranged in series in that order.

The carrier block S1 includes a carrier station 12 and a loading and unloading section 13 as shown in FIGS. 1 and 3. The carrier station 12 supports a plurality of carriers 11. The carriers 11 each accommodate a plurality of wafers W in a hermetically sealed condition. Each carrier 11 includes a side 11a provided thereon with a door (not shown) for allowing loading and unloading of each wafer W. The carrier 11 is removably mounted on the carrier station 12 so that the side 11a faces the loading and unloading section 13.

As shown in FIGS. 1 and 3, the loading and unloading section 13 includes doors 13a each facing to one of the carriers 1 on the carrier station 12. When the door 11a on the side 11a and the corresponding door 13a of the loading and unloading section 13 are opened at the same time, the inside of the carrier 11 and the inside of the loading and unloading section 13 communicate with one another. The loading and unloading section 13 provided therein with a transfer arm A1, as shown in FIGS. 2 and 3. The transfer arm A1 removes a wafer W from the carrier 11 and then delivers the wafer to the process block S2. The transfer arm A1 also receives a wafer W from the process block S2 and returns the wafer into the carrier 11.

The process block S2 is adjacent to and connected to the carrier block S1, as shown in FIGS. 1 to 3. As shown in FIGS. 1 and 2, the process block S2 includes a lower antireflective film forming block (BCT) 14, a resist film forming block (COT) 15, an upper antireflective film forming block (TCT) 16, and a developing block (DEV) 17. The DEV block 17, the BCT block 14, the COT block 15, and the TCT block 16 are arranged from a bottom side in a vertical direction in that order, as shown.

As shown in FIG. 2, the BCT block 14 contains coating units (not shown), heating and cooling units (not shown), and a transfer arm A2 that transfers a wafer W to and from these units. The coating units each coat the surface Wa of the wafer W with a chemical for forming an antireflective film. The heating and cooling units each heat the wafer W by means of a heating plate, for example, and then cools the wafer W by means of a cooling plate, for example. In this way, a lower antireflective film is formed on the surface Wa of the wafer W.

As shown in FIG. 2, the COT block 15 contains coating units (not shown), a heating and cooling units (not shown), and a transfer arm A3 that transfers the wafer W to and from these units. The coating units each coat the lower antireflective film with a chemical for forming a resist film (a resist material). The heating and cooling units each heat the wafer W by means of a heating plate, for example, and then cools the wafer W by means of a cooling plate, for example. In this way, a resist film is formed on the lower antireflective film of the wafer W. The resist material may be of either a positive type or a negative type.

As shown in FIG. 2, the TCT block 16 contains coating units (not shown), heating and cooling units (not shown), and a transfer arm A4 that transfers the wafer W to and from these units. The coating units each coat the resist film with a chemical for forming an antireflective film. The heating and cooling units each heat the wafer W by means of a heating plate, for example, and then cools the wafer W by means of a cooling plate, for example. In this way, an upper antireflective film is formed on the resist film of the wafer W.

As shown in FIGS. 2 and 3, the DEV block 17 contains a plurality of developing units (i.e., substrate processing units) U1, a plurality of heating and cooling units (thermal processing units) U2, a transfer arm A5 that transfers the wafer W to the two kinds of units, and a transfer arm A6 that transfers the wafer W between the front end and the rear end of the process block S2 without routed through the developing units U1 and the heating and cooling units U2.

Each developing units U1 performs the developing process to an exposed resist film, as described later herein. Each heating and cooling unit U2 heats the resist film on the wafer W by applying heat to the wafer W via a heating plate, for example. Each heating and cooling unit U2 also cools the heated wafer W via a cooling plate, for example. Each heating and cooling unit U2 performs a heating process such as post-exposure baking (PEB) or post-baking (PB). PEB is a process in which the resist film is heated before being developed, and PB is a process in which the resist film is heated after being developed.

As shown in FIGS. 1 to 3, a rack unit U10 is disposed on one side, facing the carrier block S1, of the process block S2. The rack unit U10 has a plurality of cells, C30 to C38. The cells C30 to C38 are vertically arranged between the level corresponding to the DEV block 17 and the level corresponding to the TCT block 16. A lifting arm A7 is disposed adjacent to the rack unit U10. The lifting arm A7 transfers the wafer W between the cells C30 to C38.

A rack unit U11 is disposed on the other side, facing the interface block S3, of the process block S2. The rack unit U11 has a plurality of cells, C40 to C42. The cells C40 to C42 are vertically arranged adjacently to the DEV block 17.

The interface block S3 is positioned between, and connected to both of, the process block S2 and the exposure apparatus E1, as shown in FIGS. 1 to 3. The interface block S3 contains a transfer arm A8 as shown in FIGS. 2 and 3. The transfer arm A8 delivers the wafer W from the rack unit U11 of the process block S2 to the exposure apparatus E1. The transfer arm A8 also receives the wafer W from the exposure apparatus E1 and then returns the wafer W to the rack unit U11.

The control unit CU comprises a control computer which includes, as shown in FIG. 1, a storage section CU1 and a control section CU2. Programs for operating various parts/units constituting the coating and developing apparatus 1 and those of the exposure apparatus E1 are stored within the storage section CU1. Although details will be described later herein, various data (e.g., the size data and position data relating to foreign matter) and images that have been acquired by an imaging unit 26 are also stored within the storage section CU1. The storage section CU1 may be, for example, a semiconductor memory, an optical recording disc, magnetic recording disk, or a magneto-optic recording disk. The above programs can also be contained in either external storage devices separated from the storage section CU1, or intangible media such as propagation signals. The programs may be preinstalled in the storage section CU1 from these external storage media and stored into the storage section CU1. The control section CU2 controls the operation of the various parts/units of the coating and developing apparatus 1 and the exposure apparatus E1.

The control unit CU is connected to the display section D and may cause the display section D to display a process parameter setting screen, results and progress of processing performed by the coating and developing apparatus 1, and other information and data. The coating and developing apparatus 1 may additionally include an input section (not shown) that enables an operator to input process parameters. In this case, the control unit CU may operate the various parts/units of the coating and developing apparatus 1 and those of the exposure apparatus E1 in accordance with the parameter values that will have been inputted into the control unit CU through the input section. The input section may be, for example, a mouse, touch panel, a pen tablet, or a keyboard.

The operation of the coating and developing apparatus 1 is next outlined below. First, a carrier 11 is placed on the carrier station 12. At this time, one side 11a of the carrier 11 is directed toward the corresponding door 13a of the loading and unloading section 13. Next, the door of the carrier 11 and the door 13a of the loading and unloading section 13 are opened at the same time and then the transfer arm A1 removes wafers W from the carrier 11 and sequentially delivers the wafers W to desired cells within the rack unit U10 of the process block S2.

After the transfer arm A1 has transferred the wafers W to the desired cells within the rack unit U10, the lift arm A7 sequentially transfers the wafers W to the cell C33, i.e., one of the cells corresponding to the BCT block 14. The wafers W that have been transferred to the cell C33 are further transferred to each unit of the BCT block 14 by the transfer arm A2. A lower antireflective film is formed on the surface Wa of each wafer W in the course of transferring of the wafer W through the BCT block 14 by the transfer arm A2.

The wafer W on which the lower antireflective film has been formed is transferred to the cell C34 directly above the cell C33, by the transfer arm A2. The wafer W that has been transferred to the cell C34 is further transferred to the cell C35 corresponding to the COT block 15, by the lift arm A7. The wafer W that has been transferred to the cell C35 is further transferred to each unit of the COT block 15 by the transfer arm A3. A resist film is formed on the lower antireflective film in the course of transferring of the wafer W through the COT block 15 by the transfer arm A3.

The wafer W on which the resist film has been formed is transferred to the cell C36 directly above the cell C35, by the transfer arm A3. The wafer W that has been transferred to the cell C36 is further transferred to the cell C37 within the TCT block 16, by the lift arm A7. The wafer W that has been transferred to the cell C37 is further transferred to each unit of the TCT block 16 by the transfer arm A4. An upper antireflective film is formed on the resist film in the course of transferring of the wafer W through the TCT block 16 by the transfer arm A4.

The wafer W on which the upper antireflective film has been formed is transferred to the cell C38 directly above the cell C37, by the transfer arm A4. The wafer W that has been transferred to the cell C38 is further transferred to the cell C32 by the lift arm A7 and then transferred to the cell C42 of the rack unit U11 by the transfer arm A6. The wafer W that has been transferred to the cell C42 is delivered to the exposure apparatus E1 by the transfer arm A8 of the interface block S3 and then the exposure process is performed to the resist film by the exposure apparatus E1. The wafer W that has undergone the exposure process is transferred to the cell C40 or C41 below the cell C42, by the transfer arm A8.

The wafer W that has been transferred to the cell C40, C41 is further transferred to each unit of the DEV block 17 and subjected to the developing process. Thus a resist pattern (an uneven pattern) is formed on the surface Wa of the wafer W. The wafer W on which the resist pattern has been formed is transferred to the cell C30 or C31 of the rack unit U10 corresponding to the DEV block 17, by the transfer arm A5. The wafer W that has been transferred to the cell C30, C31 is further transferred to a cell accessible to the transfer arm A1, by the lift arm A7 and then returned to the carrier 11 by the transfer arm A1.

The above configuration and operation of the coating and developing apparatus 1 have only been described as an example. It suffices only if the coating and developing apparatus 1 includes at least the liquid treatment units such as coating units and developing units, the pre-coating and/or post-coating processing units such as heating and cooling units, and transfer units. That is to say, the number, the types and the layout of these units can be changed as needed basis.

Figure 4:
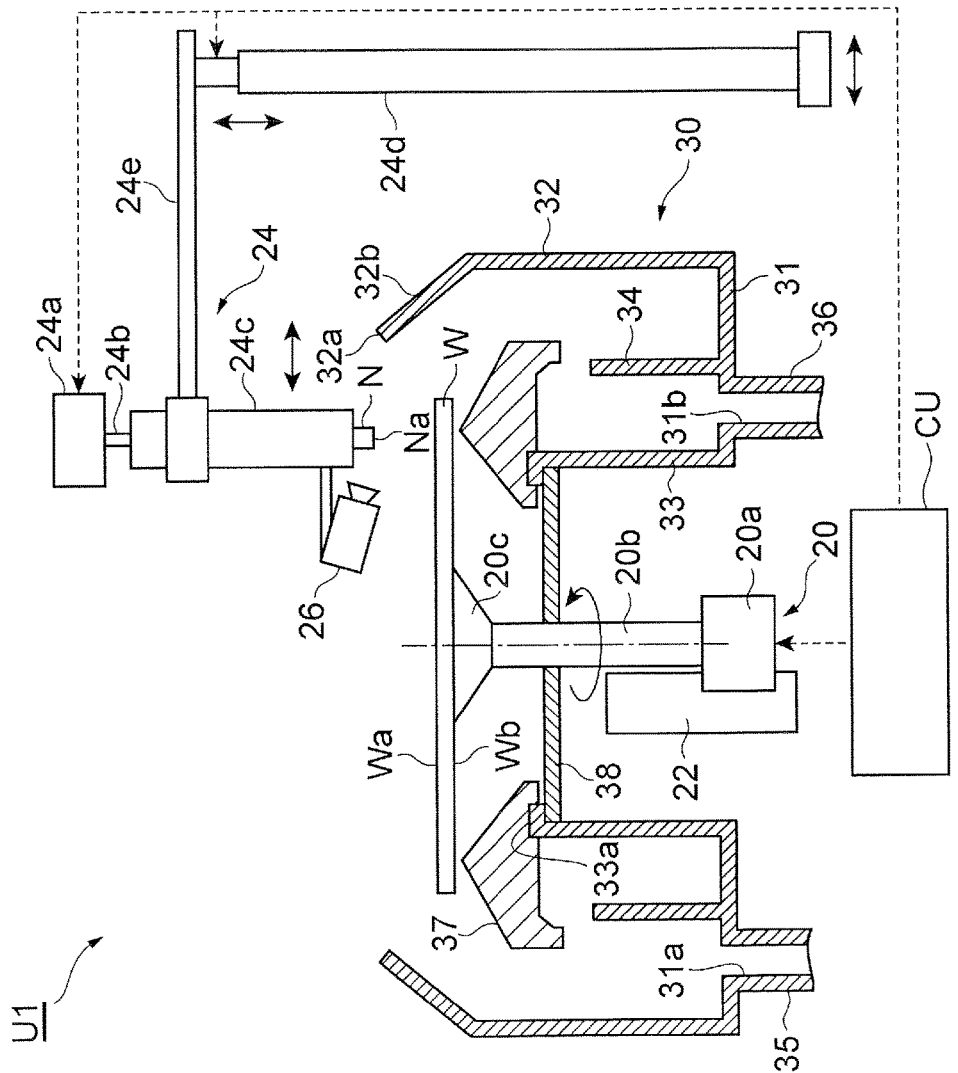
FIG. 4 is a cross-sectional view of a substrate processing apparatus.

Next, the liquid treatment units (substrate processing units) U1 are described in more detail below. Each of the liquid treatment units U1 sequentially performs a discharge process to a plurality of wafers W one by one, wherein the discharge process discharges a processing liquid toward the surface Wa of the wafer W. Each liquid treatment unit U1 includes a rotating and holding section 20, a lifting device 22, and a processing liquid supply section 24, as shown in FIG. 4.

The rotating and holding section 20 includes a main body 20a containing a motive power source such as an electric motor, a rotating shaft 20b extending vertically in an upward direction from the main body 20a, and a chuck 20c disposed at a distal end of the rotating shaft 20b. The main body 20a is driven by the motive power source to rotate the rotating shaft 20b and the chuck 20c. The chuck 20c supports a central portion of the wafer W to hold the wafer W in a substantially horizontal posture, by, for example, vacuum suctioning. In other words, while holding the wafer W substantially in the horizontal posture, the rotating and holding section 20 rotates the wafer W about a central axis (vertical axis) perpendicular to the surface Wa of the wafer W. As shown in FIG. 4, the rotating and holding section 20 rotates the wafer W, for example clockwise, as viewed from above.

The lifting device 22 is attached to the rotating and holding section 20 to vertically move the rotating and holding section 20. More specifically, the lifting device 22 moves up and down the rotating and holding section 20 (the chuck 20c) between an elevated position (transfer position) to allow the wafer W to be transferred between the transfer arm A5 and the chuck 20c, and a lowered position (developing position) to execute liquid treatment.

A cup 30 surrounds the rotating and holding section 20. When the wafer W rotates, the processing liquid supplied to the surface Wa of the wafer W is spun off and falls down from the wafer surface. The cup 30 functions as a receiving unit to receive that processing liquid. The cup 30 includes a base plate 31 having an annular shape surrounding the rotating and holding section 20, a cylindrical outer wall 32 rising from the outer edge of the base plate 31 vertically upward, and an inner wall 33 rising from the inner edge of the base plate 31 vertically upward.

The whole outer wall 32 is positioned outside of the wafer W held by the chuck 20c. The outer wall 32 has its upper end 32a positioned above the wafer W held by the rotating and holding section 20 in its lowered position. A section of the outer wall 32 including the upper end 32a is an inclined wall section 32b that is inclined so as to position more inward as it goes upward. The whole inner wall 33 is positioned inside of the circumferential edge of the wafer W held by the chuck 20c. The inner wall 32 has its upper end 33a positioned below the wafer W held by the rotating and holding section 20 in the lowered position.

A partition wall 34 rising vertically from an upper surface of the base plate 31 is disposed between the inner wall 33 and the outer wall 32. This means that the partition wall 34 surrounds the inner wall 33. A liquid draining hole 31a is formed in a section of the base plate 31 that exists between the outer wall 32 and the partition wall 34. A gas discharging hole 31b is formed in a section of the base plate 31 between the partition wall 34 and the inner wall 33. An exhaust pipe 36 is connected to the gas discharging hole 31b.

An umbrella-shaped section 37 overhung outward relative to the partition wall 34 is disposed over the inner wall 33. The processing liquid that has been spun off and fallen down from the wafer surface is guided between the outer wall 32 and the partition wall 34 and drained through the liquid draining hole 31a. Gases and other substances originated from the processing liquid move in a space between the partition wall 34 and the inner wall 33, and these gases and substances are discharged through the gas discharging hole 31b.

An upper portion of a space surrounded by the inner wall 33 is closed by a partition plate 38. The main body 20a of the rotating and holding section 20 is positioned below the partition plate 38. The chuck 20c is positioned above the partition plate 38. The rotating shaft 20b is inserted in a through-hole formed centrally in the partition plate 38.

The processing liquid supply section 24 includes a processing liquid supply source 24a, a head 24c, a mobile body 24d, and the imaging unit 26, as shown in FIG. 4. The processing liquid supply source 24a includes a processing liquid storage container, a pump, a valve, and so on. The processing liquid is, for example, a cleaning liquid (a rinsing liquid) or a developer. The cleaning liquid is, for example, pure water or deionized water (DIW). The head 24c is connected to the supply source 24a via a supply pipe 24b. During the supply of the processing liquid, the head 24c is positioned above the surface Wa of the wafer W. A liquid nozzle N provided on the head 24c opens downward so as to be directed toward the wafer surface Wa. The head 24c, therefore, discharges through the liquid nozzle N toward the surface Wa of the wafer W the processing liquid that has been supplied from the supply source 24a in response to a control signal sent from the control unit CU.

The mobile body 24d is connected to the head 24c via an arm 24e. The mobile body 24d moves horizontally along a guide rail (not shown) in response to another control signal sent from the control unit CU. Thus during the discharge process in which the processing liquid is discharged through a discharging port Na of the liquid nozzle N, the mobile body 24d moves horizontally above the wafer W existing in a lowered position, and along a line orthogonal to a central axis of the wafer W, across a diameter of the wafer W. The mobile body 24d moves the arm 24e vertically under yet another control signal from the control unit CU, whereby the head 24c moves vertically to approach or recede from the surface Wa of the wafer W.

The imaging unit 26 is disposed near the distal end of the head 24c, as shown in FIG. 4, and moves together with the head 24c. The imaging unit 26 images the discharging port Na of the liquid nozzle N. The images that the imaging unit 26 has acquired are transmitted to a control section CU2 of the control unit CU. By processing each of the received images, the control section CU2 acquires size data indicating the size of foreign matter(s) (e.g., data on the maximum diameter of the foreign matter or the area of the foreign matter) present in the discharging port Na part of the liquid nozzle N (i.e., an area near the discharging port Na of the liquid nozzle N). The foreign matter in the present embodiment include, for example, liquid droplets, solid matter (contaminants), and flaws present in the discharging port Na part of the liquid nozzle N. In the present embodiment, the flaws are regarded as foreign matter because liquid or the like is likely to accumulate in the dents accompanied with the flaws. With reference to a size data history in which the size data is arranged in chronological order, the control section CU2 judges whether an abnormality in wafer-processing has occurred, using the first and second criteria described below.

(First Criteria)

The control section CU2 compares each acquired size data with a second threshold value TH1, and if the acquired size data is not smaller than the threshold value TH1, the control section CU2 immediately judges that an abnormality in wafer-processing has occurred. For example, in a case where the size data is related to the maximum diameter of the foreign matter, the threshold value TH1 may be set to be about 1.5 mm.

(Second Criteria)

If two criteria are met, that is, if (1) each acquired size data is not smaller than a first threshold value TH2 (the threshold value TH2 is smaller than the second threshold value TH1), and if (2) the number of continuous acquisition of the size data, indicating how many times the size data not less than the threshold value TH2 has been acquired continuously, exceeds a predetermined value, then the control section CU2 estimates that the foreign matter having a relatively-large size has been continuously present in the discharging port Na part of the liquid nozzle N. For this reason, the control section CU2 regards it as highly probable that the foreign matter present in the discharging port Na part of the liquid nozzle N would fall onto the surface Wa of the wafer W, and thus judges that an abnormality in wafer-processing has occurred. For example, in a case where the size data is related to the maximum diameter of the foreign matter, the threshold value TH2 may be set to be about 1.0 mm. For example, the number of continuous acquisition may be set to be nine (9). In this case, once the number of continuous acquisition of the size data not less than the threshold value TH2 has reached ten (10), the control section CU2 judges that an abnormality in wafer-processing has occurred.

Next, explanations are made for the operations performed based on the first and second criteria in the below five hypothetical cases.

(First Hypothetical Case)

Figure 5:
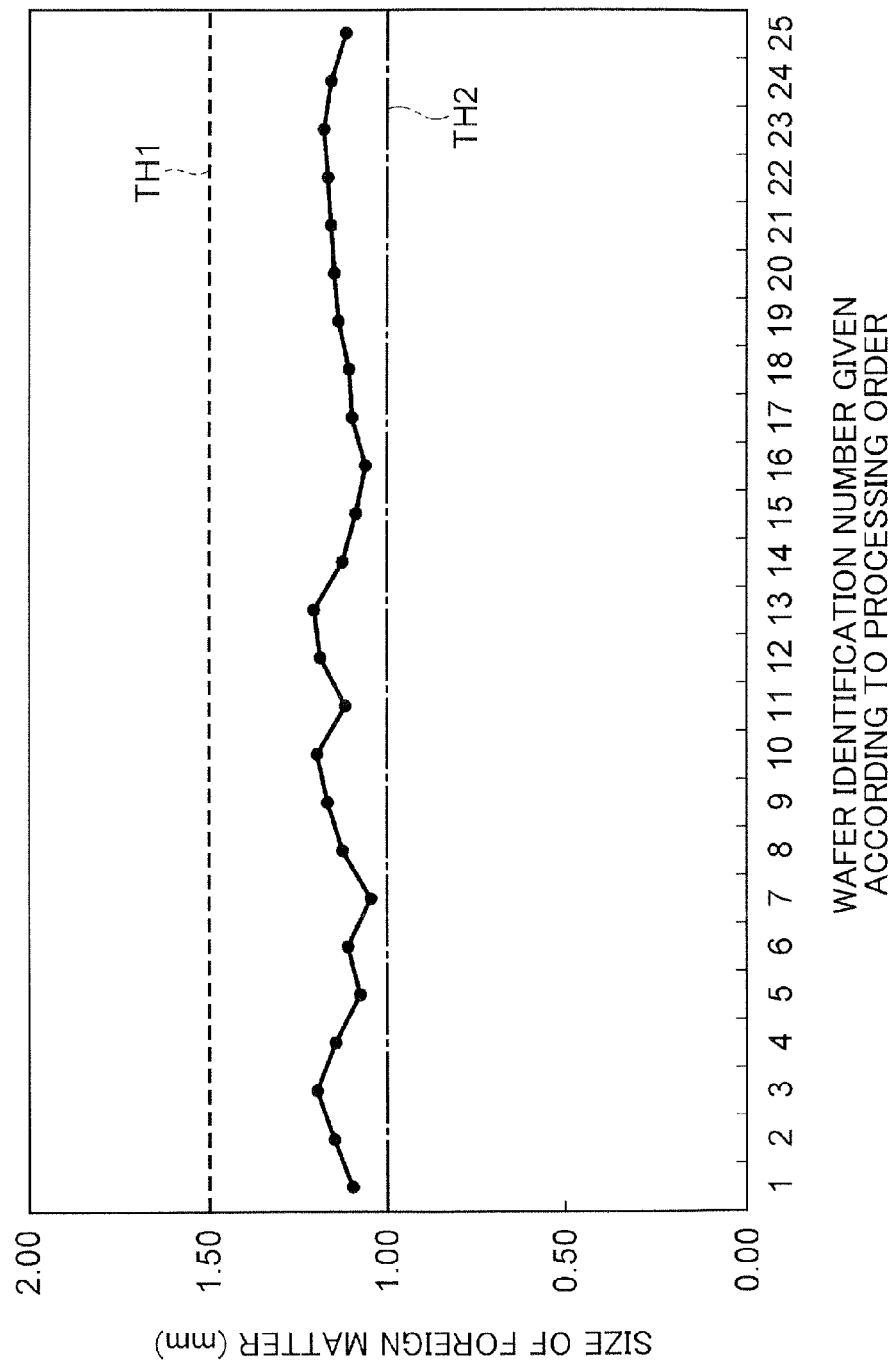
FIG. 5 is a diagram showing a first example of a history relating to size data of foreign matter.

In a first hypothetical case, each size data are not smaller than the threshold value TH2 and is not larger than the threshold value TH1, as shown in FIG. 5. In this case, for example, when the 10th wafer W is processed, the number of continuous acquisition of the size data not smaller than the threshold value TH2 reaches ten (10), which meets the second criteria, so that the control section CU2 judges that an abnormality in wafer-processing has occurred.

On the basis of the judgment result that an abnormality has occurred, the control section CU2 may stop the operation of the liquid treatment unit U1 and may cause a loudspeaker (not shown) to generate an alarm sound to caution the operator or the like about the probability of defect occurrence. If the alarm sound is actually generated, inspection of the discharging port Na part of the liquid nozzle N, removal of the foreign matter present in the discharging port Na part of the liquid nozzle N, and so on may be conducted. The foreign matter may be removed manually by the operator or the like, or may be removed by a cleaning device (not shown) provided in the liquid treatment unit U1. Since no foreign matter adheres to the discharging port Na part of the liquid nozzle N after cleaning, the control section CU2 may resume the operation of the liquid treatment unit U1 and then reset the count of the number of continuous acquisition to zero (0) before processing of the following 11th wafer W is started.

(Second and Third Hypothetical Cases)

Figure 6:
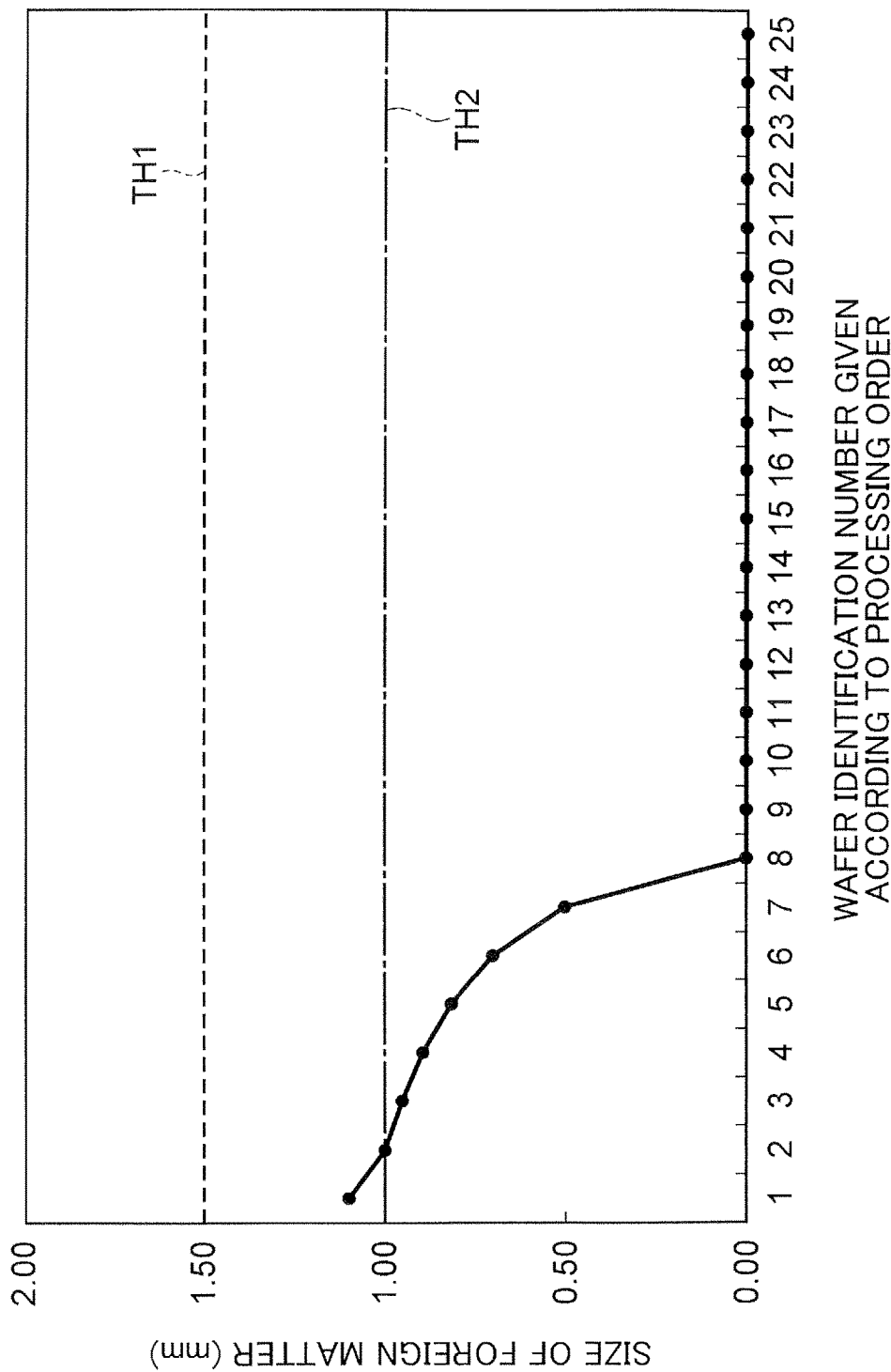
FIG. 6 is a diagram showing a second example of a history relating to size data of foreign matter.
Figure 7:
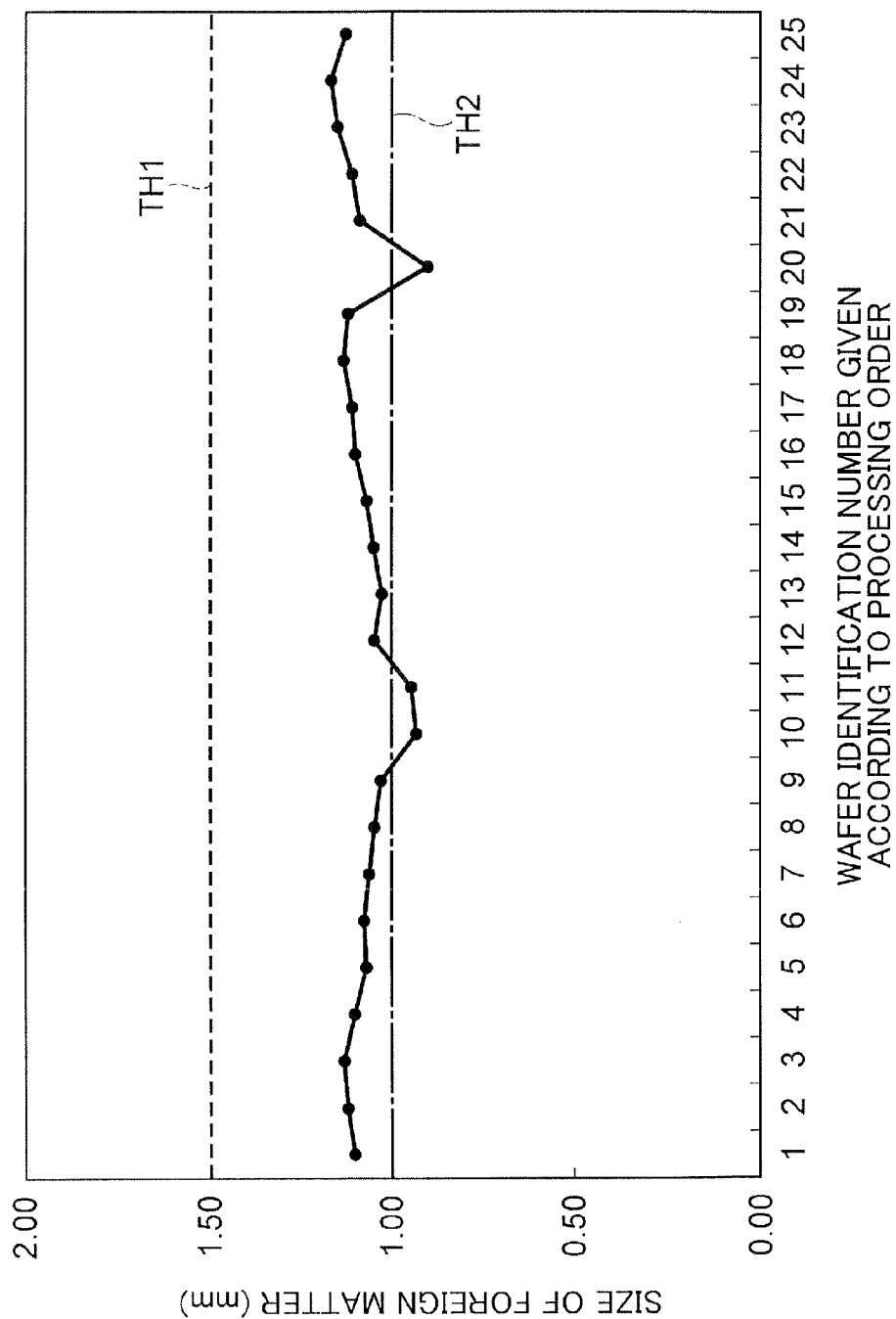
FIG. 7 is a diagram showing a third example of a history relating to size data of foreign matter.

In second and third hypothetical cases, as respectively shown in FIGS. 6 and 7, the size data is at first not smaller than the threshold value TH2 and not larger than the threshold value TH1, and then, the size data later becomes less than the threshold value TH2 before the number of continuous acquisition of the size data not smaller than the threshold value TH2 reaches ten (10). In the second hypothetical case, since the size data gradually becomes small and finally reaches zero (0), the liquid droplets as the foreign matter are estimated to have evaporated to become smaller in size. In the third hypothetical case, the size data varies across the threshold value TH2. It can be estimated that these variations are caused by blurring of the acquired image and/or inclusion of noise in the image. In these situations, the foreign matter present at the discharging port Na part of the liquid nozzle N is less likely to fall onto the surface Wa of the wafer W.

As can be seen from the above, neither the first criteria nor the second criteria is met in the second and third hypothetical cases. This means that the control section CU2 does not judge that an abnormality in wafer-processing has occurred. As in the second and third hypothetical cases, if the size data becomes not larger than the threshold value TH2 before the number of continuous acquisition of the size data not smaller than the threshold value TH2 reaches ten (10), the control section CU2 may reset the count of the number of continuous acquisition to zero (0) prior to processing of the following wafers W.

(Fourth Hypothetical Case)

Figure 8:
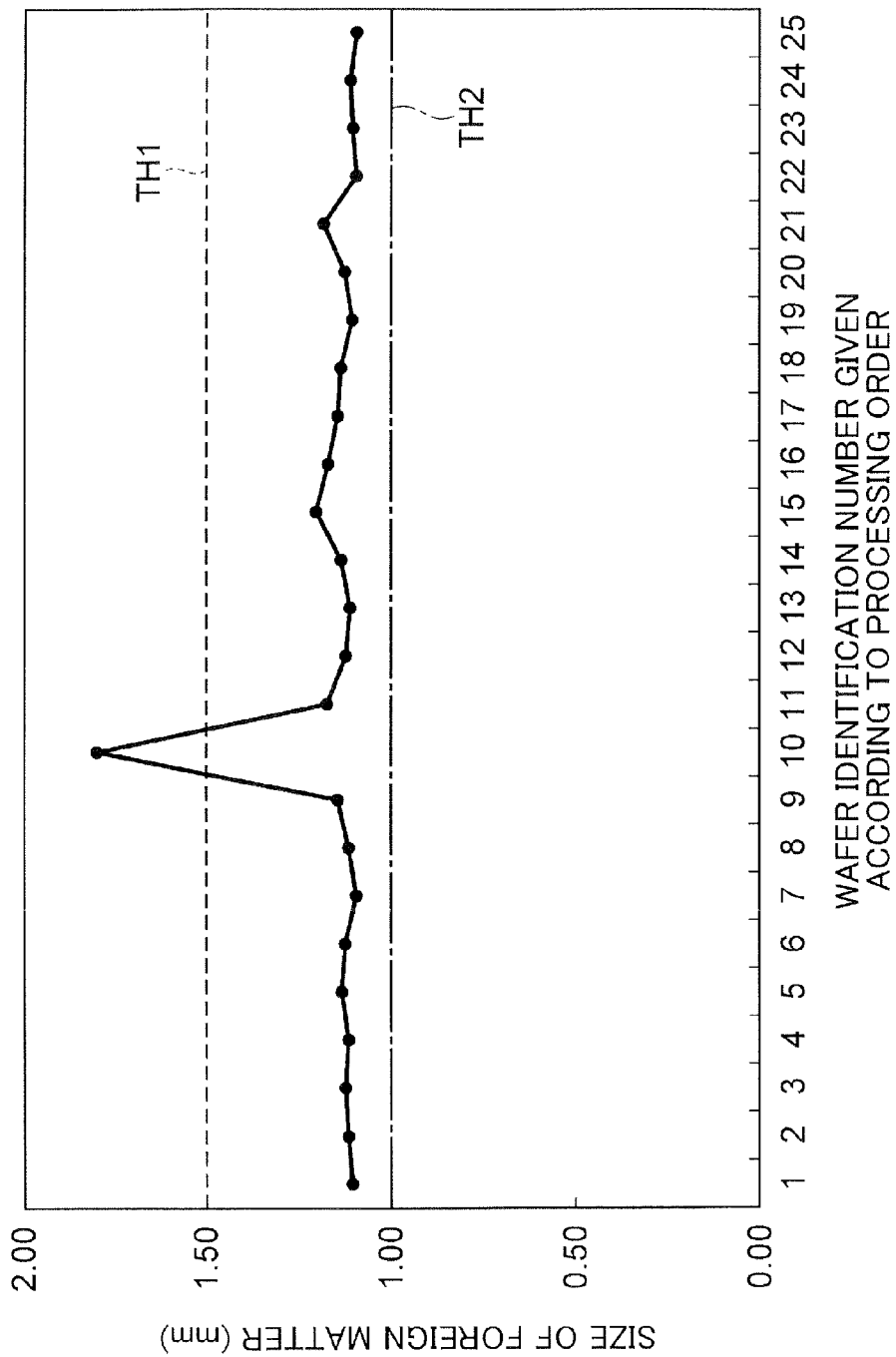
FIG. 8 is a diagram showing a fourth example of a history relating to size data of foreign matter.
Figure 9:
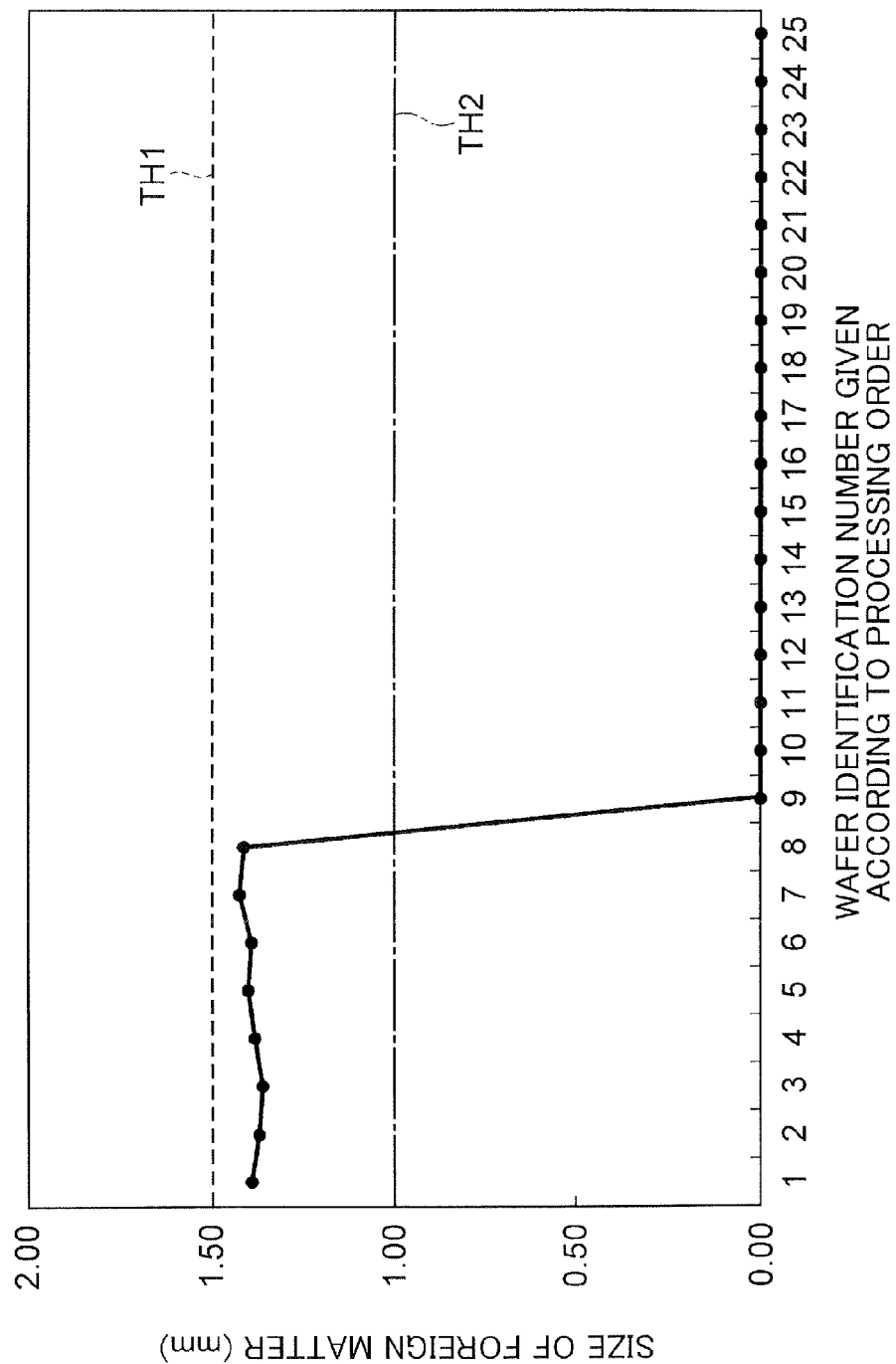
FIG. 9 is a diagram showing a fifth example of a history relating to size data of foreign matter.

In a fourth hypothetical case, the size data not smaller than the threshold value TH1 is acquired as shown in FIG. 8. This case meets the first criteria, so that the control section CU2 immediately judge that an abnormality has occurred in processing of the wafer W.

(Fifth Hypothetical Case)

In a fifth hypothetical case, as shown in Hg. 9, the size data is at first not smaller than the threshold value TH2 and is not larger than the threshold value TH1, and then, the size data later decreases below the threshold value TH2 before the number of continuous acquisition of the size data not smaller than the threshold value TH2 reaches ten (10). While in this respect the fifth hypothetical case is the same as the second and third hypothetical cases, the former differs from the latter two in that the change in the size data is rapid and sharp. More specifically, in the fifth hypothetical case, the size data during the processing of the eighth wafer W is 1.42 mm and the size data during the processing of the ninth wafer W is 0 mm. The reduction in the size data is 1.42 mm.

In this case, it is supposed that the size of the foreign matter existing in the discharging port Na part of the liquid nozzle N during the processing of the ninth wafer W is rapidly reduced as compared with that of during the processing of the eighth wafer W. It is thus highly probable that the foreign matter which had been existing at the discharging port Na part of the liquid nozzle N would have fallen onto the surface Wa of the wafer W. In the fifth hypothetical case neither the first criteria nor the second criteria are met. However, the control section CU2 further uses a third criteria that the amount of reduction in size data is not smaller than a predetermined value or that the reduction rate is not smaller than a predetermined value. In the fifth hypothetical case, the third criteria is met, so that the control section CU2 judges that an abnormality has occurred during the processing of the wafer W. If the judgment is made based on the amount of reduction, the predetermined value (of the amount of reduction) may be set to 1.0 mm, for example. If the reduction rate is used in the judgment, the predetermined value (of the reduction rate) may be set to 50 percent, for example.

In the foregoing embodiment, in accordance with the history of the size data arranged in chronological order, when the number of continuous acquisition of the size data not smaller than the threshold value TH2 exceeds the predetermined value, it is judged that an abnormality in wafer-processing has occurred. Thus, acquiring of size data not smaller than the threshold value TH2 will not immediately result in a judgment that an abnormality has occurred. In other words, two criteria need to be met in order to judge that an abnormality in wafer-processing has occurred. One is that the size data has become not smaller than the threshold value TH2, and the other is that the number of continuous acquisition of such size data has exceeded the predetermined value. If the two criteria are met, it is supposed that the foreign matter having a relatively-large size has continued to exist at the discharging port Na part of the liquid nozzle N. It can be thus judged to be highly probable that the foreign matter existing at the discharging port Na part of the liquid nozzle N would fall onto the surface Wa of the wafer W. The fact that an abnormality in wafer-processing has occurred, therefore, can also be judged accurately.

Figure 10:
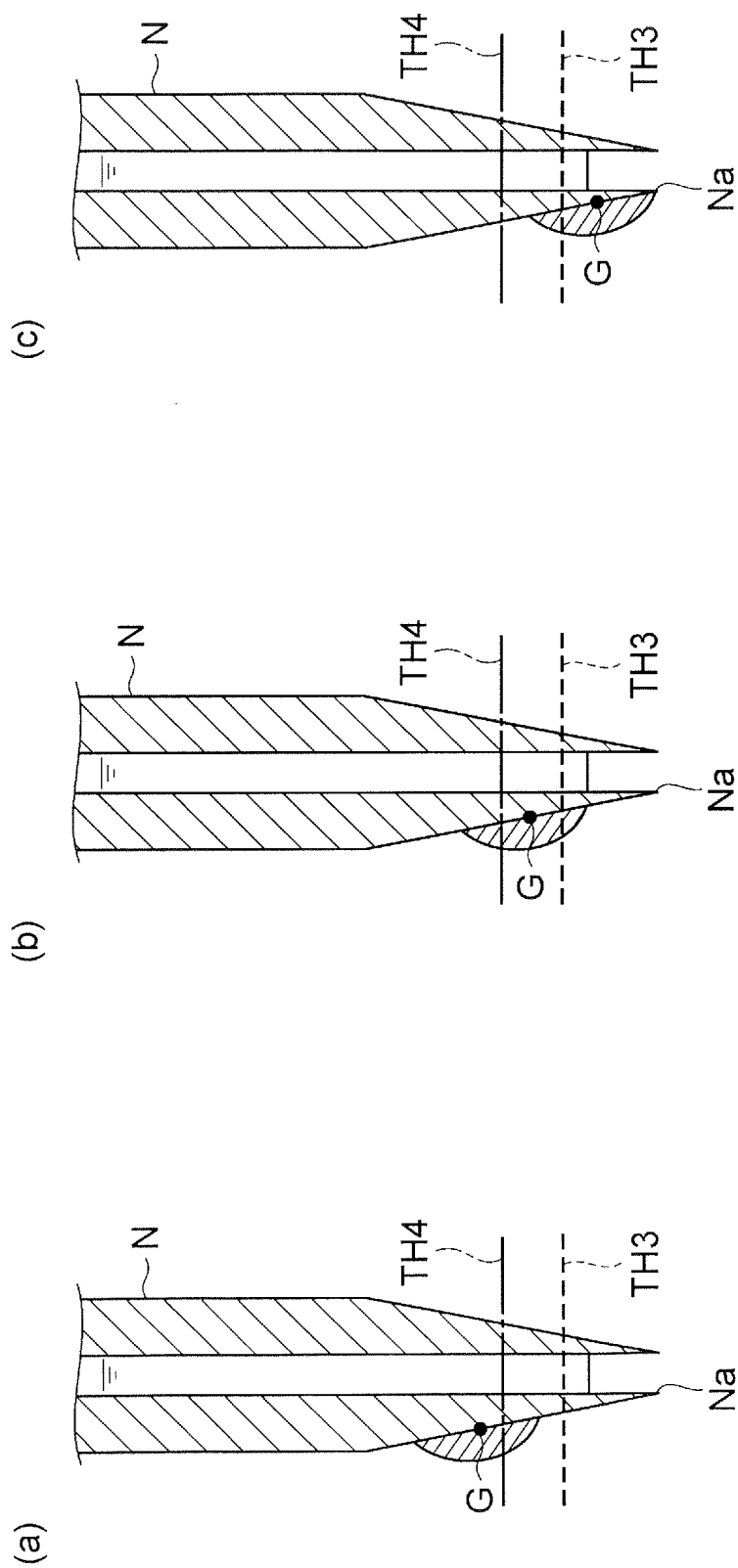
FIG. 10 is a diagram for illustrating a method that uses position data about foreign matter to determine occurrence of an abnormality.

An embodiment of the present invention has been described in detail above, but the invention is not limited to the foregoing embodiment. For example, when the control section CU2 judges whether an abnormality in wafer-processing has occurred, a history relating to foreign-matter position data arranged in chronological order may be used instead of size data or together with the size data. The position data used here is data that represents height positions of any foreign matter existing at the discharging port Na part of the liquid nozzle N. The height positions of the foreign matter may be the gravity center position G of the foreign matter, as shown in FIG. 10. Herein, the parameter value expressing the height position increases as the height level becomes higher. After processing each of the images received from the imaging unit 26, the control section CU2 acquires the position data related to the foreign matter present at the discharging port Na part of the liquid nozzle N. Based on the history in which the acquired position data is arranged in chronological order, the control section CU2 uses the following fourth criteria or fifth criteria to judge whether an abnormality in wafer-processing has occurred.

(Fourth Criteria)

The control section CU2 compares the acquired position data with a second threshold value TH3, and if the acquired position data is not larger than the threshold value TH3, the control section CU2 immediately judges that an abnormality in wafer-processing has occurred. For example, if a reference point (origin) for the height position is set at the tip end of the discharging port Na of the liquid nozzle N, the threshold value TH3 may be set to be about 1.0 mm.

(Fifth Criteria)

If two criteria are met, that is, (1) if the acquired position data is not larger than a first threshold value TH4 (the threshold value TH4 is larger than the threshold value TH3), and if (2) the number of continuous acquisition of the position data, indicating how many times the position data not larger than the threshold value TH4, has been acquired continuously, exceeds a predetermined value, it is supposed that a foreign matter has been continuously existing at the discharging port Na of the liquid nozzle N. For this reason, the control section CU2 regards it as highly probable that the foreign matter present at the discharging port Na part of the liquid nozzle N would fall onto the surface Wa of the wafer W, and thus judges that an abnormality in wafer-processing has occurred. For example, if a reference point (origin) for the height position is set to the tip end of the discharging port Na of the liquid nozzle N, the threshold value TH4 may be set to be about 1.5 mm. For example, the predetermined value of the number of continuous acquisition may be set to be about nine (9). In this case, once the number of continuous acquisition of the position data not larger than the threshold value TH4 has reached ten (10), the control section CU2 judges that an abnormality in wafer-processing has occurred.

Next, detailed explanations are made for the operations performed in the following three hypothetical cases based on the fourth or fifth criteria.

(Sixth Hypothetical Case)

In a sixth hypothetical case, each position data is not larger than the threshold value TH4, and not smaller than the threshold value TH3, as shown in FIG. 10(b). In this case, for example, during the processing of the 10th wafer W, the number of continuous acquisition of the data not smaller than the threshold value TH2 reaches ten (10), which meets the fifth criteria, so that the control section CU2 judges that an abnormality has occurred during the processing of the wafer W. The operations after judgment of abnormality occurrence may be the same as in the first hypothetical case.

(Seventh Hypothetical Case)

In a seventh hypothetical case, the position data is at first not larger than the threshold value TH4 and not smaller than the threshold value TH3 (see FIG. 10 (b)), the position data exceeds the threshold value TH4 before the number of continuous acquisition of the position data not larger than the threshold value TH4 (see FIG. 10 (a)). The seventh hypothetical case includes a situation where the position data varies across the threshold value TH4. In this case, it is estimated that such variations are caused by blurring of the acquired image and/or inclusion of noise in the image, the foreign matter present at the discharging port Na port of the liquid nozzle N is less likely to fall onto the surface Wa of the wafer W.

As can be seen from the above, neither the fourth criteria nor the fifth criteria is met in the seventh hypothetical case, which means that the control section CU2 does not judge that an abnormality in wafer processing has occurred. As in the seventh hypothetical case, before the number of continuous acquisition of the position data not larger than the threshold value TH4 reaches ten (10), if the position data becomes less than the threshold value TH4, the control section CU2 may reset the count of the number of continuous acquisition to zero (0) prior to processing of the following wafer W.

(Eighth Hypothetical Case)

In an eighth hypothetical case, position data not larger than the threshold value TH3 has been acquired as shown in FIG. 10(c). This case meets the fourth criteria, so the control section CU2 immediately judges that an abnormality in wafer-processing has occurred.

In the above judgment based on the fourth and/or fifth criteria, the height position of the foreign matter may be determined (calculated) with the tip end of the discharging port Na of the liquid nozzle N being set as a reference height position (origin), or with a point different from the tip end being set as a reference height position. The position data may include horizontal position of the foreign matter in addition to the height position of the foreign matter.

Although the foregoing embodiment employs one imaging unit, 26, to acquire images of foreign matter, foreign matter may be imaged using two or more imaging units 26 so that the control section CU2 may create a stereoscopic image of the foreign matter. In this case, the control section CU2 acquires size data and/or position data based on the stereoscopic image.

In the foregoing description, the explanation has been made for the case where one piece of foreign matter is present at the discharging port Na part of the liquid nozzle N. In a case where plural pieces of foreign matter are present at the discharging port Na part of the liquid nozzle N, substantially the same judgment as described above may also be performed to each piece of foreign matter independently. In a case where plural pieces of foreign matter are present at the discharging port Na part of the liquid nozzle N, the judgment may be conducted only for one foreign matter having the largest size. In a case where plural pieces of foreign matter are present at the discharging port Na part of the liquid nozzle N, the use of the position data which includes the horizontal position allows independent monitoring of each piece of foreign matter. With this method, judgment can be done even in a case where a piece of foreign matter moves to merge with another piece of foreign matter.

Figure 11:
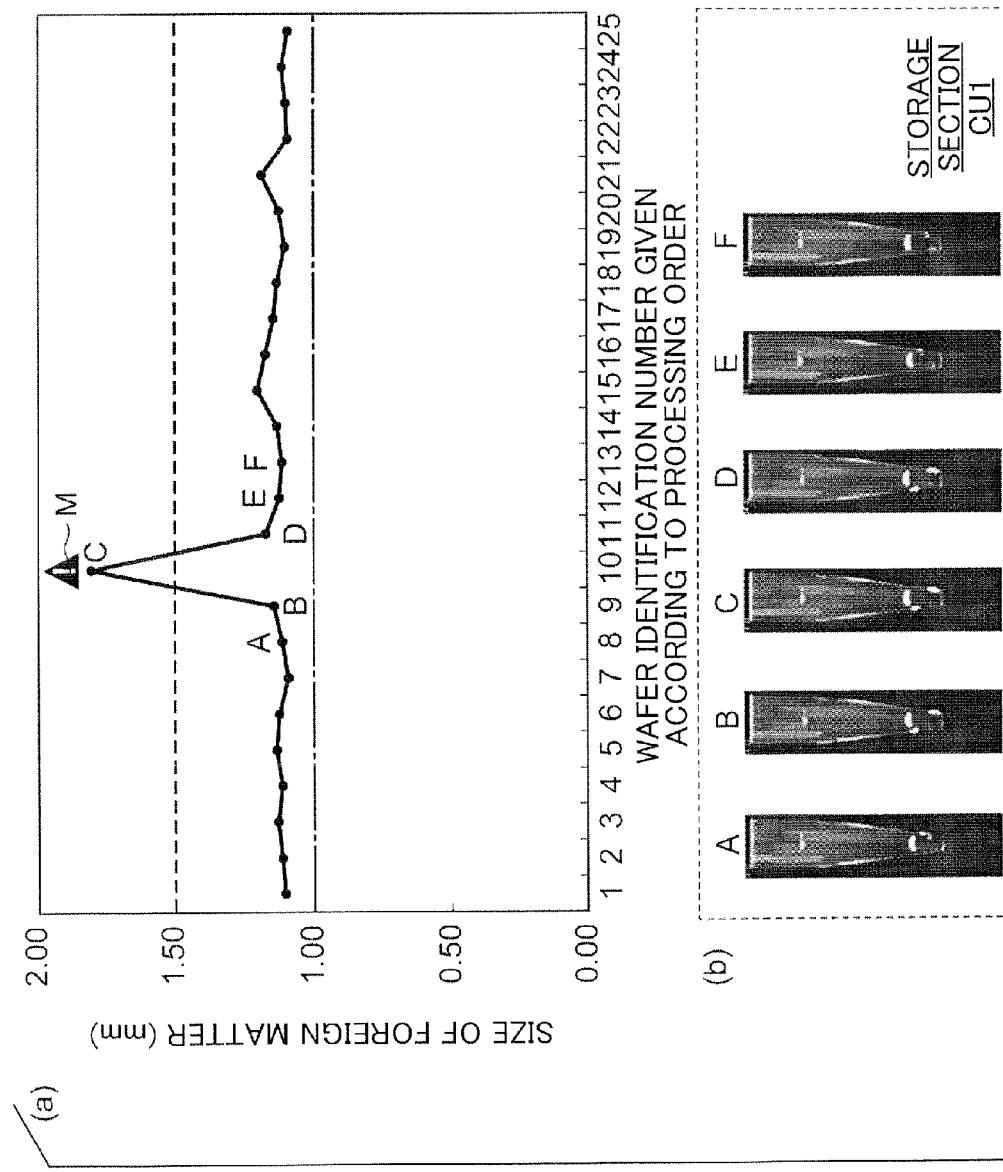
FIG. 11 is a diagram for illustrating a method of presenting examples of acquired images.

The control section CU2 may cause the display section D to display the history in which the acquired size data or position data are arranged in chronological order. An example of a history relating to size data arranged in chronological order is shown in FIG. 11(a). In this example, the storage section CU1 may store the image of the discharging port Na part of the liquid nozzle N with the size data (acquired based on the image) being associated with the image. In one example, the storage section CU1 may store the images A to F shown in shown in FIG. 11(b) with the size data A to F shown in FIG. 11(b) being associated with the corresponding images A to F. In this case, when the control section CU2 receives from the input section a signal for selecting any one of the size data displayed on the display section D, the control section CU2 may cause the display section D to display the image associated with the selected size data. More specifically, upon receiving from the input section the signal for selecting size data C from size data shown in FIG. 11(a), the control section CU2 refers to the storage section CU1 in accordance with the signal and causes the display section D to display the corresponding image C. This facilitates identification of causes of a defect occurring on the wafer W.

When the aforementioned one or more criteria (criteria 1 to 5) are met so that it is judged that an abnormality in wafer-processing has occurred, a symbol or mark for cautioning the operator or the like may be displayed in vicinity of the size data which is the basis of abnormality judgment. For example, a warning mark M may be displayed near size data C, as shown in FIG. 11(a).

The invention claimed is:

1. A liquid treatment method, employing a substrate processing apparatus that sequentially perform, to a plurality of substrates one by one, a discharging process of discharging a processing liquid through a discharging port of a liquid nozzle toward a surface of the substrate positioned below the liquid nozzle, the liquid treatment method comprising:

(A) imaging a discharging port part of the liquid nozzle each time the discharging process is performed to one substrate, and acquiring, from images thus obtained, size data on foreign matter possibly present at the discharging port part; and (B) based on a history of the size data arranged in chronological order, judging whether an abnormality in substrate-processing has occurred;

wherein in the item (B), if the number of continuous acquisition, indicating how many times the size data not smaller than a first threshold value has been acquired continuously, exceeds a predetermined value, then judging that an abnormality in substrate-processing has occurred.

2. The liquid treatment method according to claim 1, wherein, in the item (B), a count of the number of continuous acquisition is reset when the number of continuous acquisition reaches the predetermined value.

3. The liquid treatment method according to claim 1 wherein, in the item (B), a count of the number of continuous acquisition is reset when the size data becomes smaller than the first threshold value before the number of continuous acquisition reaches the predetermined value.

4. The liquid treatment method according to claim 1, further comprising:
(C) if the size data is not smaller than a second threshold value which is larger than the first threshold value, judging that an abnormality in substrate-processing has occurred.

5. The liquid treatment method according to claim 1, wherein, in the item (B), if a first size data acquired at a first acquisition timing is smaller than a second size data acquired at a second acquisition timing immediately before the first acquisition timing and if ana reduction amount or ana reduction rate of the first size data with respect to the second size data is not smaller than a predetermined value, it is judged that an abnormality in substrate-processing has occurred.

6. The liquid treatment method according to claim 1, further comprising:
(D) storing the images obtained upon execution of item (A) with the size data acquired from those images being associated with those images;
(E) displaying on a display section the history of the size data arranged in chronological order; and
(F) upon receipt of a signal for selecting any one of the size data displayed on the display section, displaying one of the acquired images corresponding to the selected size data.

7. A liquid treatment method, employing a substrate processing apparatus that sequentially perform, to a plurality of substrates one by one, a discharging process of discharging a processing liquid through a discharging port of a liquid nozzle toward a surface of the substrate positioned below the liquid nozzle, the liquid treatment method comprising:
(A) imaging a discharging port part of the liquid nozzle each time the discharging process is performed to one substrate, and acquiring, from images thus obtained, position data indicating a height position of foreign matter possibly present at the discharging port part; and
(B) based on a history of the position data arranged in chronological order, judging whether an abnormality in substrate-processing has occurred;
wherein in the item (B), if the number of continuous acquisition, indicating how many times the position data not larger than a first threshold value has been acquired continuously, exceeds a predetermined value, then judging that an abnormality in substrate-processing has occurred.

8. The liquid treatment method according to claim 7, wherein, in the item (B), a count of the number of continuous acquisition is reset when the number of continuous acquisition reaches the predetermined value.

9. The liquid treatment method according to claim 7, further comprising:
(C) when the position data not larger than a second threshold value which is smaller than the first threshold value, judging that an abnormality in substrate-processing has occurred.

10. The liquid treatment method according to claim 7, further comprising:
(D) storing the images obtained upon execution of item (A) with the position data acquired from those images being associated with those images;
(E) displaying on a display section the history of the position data arranged in chronological order; and
(F) upon receipt of a signal for selecting any one of the position data displayed on the display section, displaying one of the acquired images corresponding to the selected position data.

11. A substrate processing apparatus comprising:
a liquid nozzle that discharges a processing liquid through a discharging port thereof toward a surface of a substrate positioned below;
an imaging unit that images a discharging port part of the liquid nozzle; and
a control section, wherein the control section performs a control procedure when the substrate processing apparatus sequentially perform, to a plurality of substrates one by one, a discharging process of discharging the processing liquid through the discharging port of the liquid nozzle, the control procedure including:
(A) causing the imaging unit to image the discharging port part of the liquid nozzle each time the discharging process is performed to one substrate, and acquiring, from images thus obtained, size data on foreign matter possibly present at the discharging port part; and
(B) based on a history of the size data obtained in item (A) and arranged in chronological order, judging whether an abnormality in substrate-processing has occurred;
wherein in the item (B), if the number of continuous acquisition, indicating how many times the size data not smaller than a first threshold value has been acquired continuously, exceeds a predetermined value, then judging that an abnormality in substrate-processing has occurred.

12. A substrate processing apparatus comprising:
a liquid nozzle that discharges a processing liquid through a discharging port thereof toward a surface of a substrate positioned below;
an imaging unit that images a discharging port part of the liquid nozzle; and
a control section,
wherein the control section performs a control procedure when the substrate processing apparatus sequentially perform, to a plurality of substrates one by one, a discharging process of discharging the processing liquid through the discharging port of the liquid nozzle, the control procedure including:
(A) causing the imaging unit to image the discharging port part of the liquid nozzle each time the discharging process is performed to one substrate, and acquiring, from images thus obtained, position data indicating a height position of foreign matter possibly present at the discharging port part; and
(B) based on a history of the position data obtained in item (A) and arranged in chronological order, judging whether an abnormality in substrate-processing has occurred;
wherein in the item (B), if the number of continuous acquisition, indicating how many times the position data not larger than a first threshold value has been acquired continuously, exceeds a predetermined value, then judging that an abnormality in substrate-processing has occurred.

13. A non-transitory storage medium storing programs to cause a substrate processing apparatus to perform the method according to claim 1.

14. A non-transitory storage medium storing programs to cause a substrate processing apparatus to perform the method according to claim 7.

* * * * *